United States Patent [19]

Suzuki

[11] Patent Number: 5,271,039
[45] Date of Patent: Dec. 14, 1993

[54] LOCAL OSCILLATING DEVICE

[75] Inventor: Mitsuhiro Suzuki, Tokyo, Japan

[73] Assignee: Sony Corporation, Tokyo, Japan

[21] Appl. No.: 706,959

[22] Filed: May 29, 1991

[30] Foreign Application Priority Data

Jun. 26, 1990 [JP] Japan .................................. 2-165539

[51] Int. Cl.⁵ ............................................ H03D 3/24
[52] U.S. Cl. ....................................... 375/81; 375/84; 375/120; 329/307; 455/208
[58] Field of Search ....................... 375/52, 56, 81, 83, 375/84, 87, 111, 118, 119, 120; 329/306, 307, 325, 346, 358, 360, 361; 455/205, 208; 331/1 R, 9, 18

[56] References Cited

U.S. PATENT DOCUMENTS

| | | | |
|---|---|---|---|
| 4,320,345 | 3/1982 | Waggener | 329/307 |
| 4,475,216 | 10/1984 | Noguchi | 375/81 |
| 4,789,948 | 12/1988 | Von der Embse | 375/81 |
| 4,896,336 | 1/1990 | Henely et al. | 375/84 |
| 5,128,626 | 7/1992 | Iwasaki | 375/81 |

*Primary Examiner*—Curtis Kuntz
*Assistant Examiner*—Young Tse
*Attorney, Agent, or Firm*—Ronald P. Kananen

[57] ABSTRACT

There is disclosed a local oscillating device useful for a communication system where frequency conversion is implemented to data signals received in a burst manner, particularly for INMARSAT STC-C (International Maritime Satellite Organization Standard - C) system. This local oscillating device comprises a local oscillating circuit including a quartz-crystal oscillator of which oscillating frequency can be controlled, an A/D converter for converting a received phase modulated signal to a received digital signal by using a sampling clock from the local oscillating circuit, and a demodulation circuit for reproducing a symbol clock serving as reference of demodulation from the received digital signal from the A/D converter to demodulate the received digital signal by using the symbol clock, and to detect information indicative of a phase difference between the symbol clock and the sampling clock, thus to control an oscillating frequency of the quartz-crystal oscillator on the basis of the phase difference information to output a local oscillating signal of a predetermined frequency.

10 Claims, 2 Drawing Sheets

LOCAL OSCILLATING DEVICE

BACKGROUND OF THE INVENTION

1. Field of the Invention

This invention relates to a local oscillating device, and more particularly to a local oscillating device for, e.g., INMARSAT STD-C (International Maritime Satellite Organization Standard-C) system.

2. Prior art

International trans-ocean communications, i.e., communications between a mobile earth station and a coast earth station or communication between mobile earth stations are dependent upon short wave. However, these international transocean communications suffer from communication time zone and/or the coverage restrictions which render them somewhat inadequate in terms of communication quality and the circuit capacity. In view of this, a so-called INMARSAT (International Maritime Satellite Organization) was inaugurated in 1979. As a result, the use of a Maritime Satellite Communication System (hereinafter referred to as INMARSAT system) has been used in the Atlantic Ocean since 1982.

This INMARSAT system enables communication between a mobile earth station and a coast earth station or between mobile earth stations relaying a geostationary satellite or a mobile satellite, and is composed of a Network Coordination Station (NCS) for controlling the satellite, the circuit or traffic, a Coast Earth Station (CES) on the earth side, and a Mobile Earth Station (MES) on the ship side, and so on.

Further, the above-mentioned mobile earth station is classified into a standard A station, a standard B station, a standard C station and a standard D station in accordance with the service provided.

More specifically, the standard A station uses a parabolic antenna having a diameter of about 1.2 m, and has the capability of carrying out low speed data communication such as a telephone or a telex, etc., audio band data communication, and high speed data (mobile earth station-coast earth station) of 56K bps. The standard B station is directed to small ship communications. This station aims at utilizing a small economical shipboard antenna (short backfire antenna having a diameter of about 0.4 m) to enable low speed data communication such as a telephone or a telex, etc. The standard C station is also directed to small ship communications wherein a short backfire antenna or a dipole antenna, for example, is used. This station is principally directed toward distress safety communications, and has the capability of carrying out low speed data commnication such as distress safety communication or telex, etc. Finally, the standard D station includes a parabolic antenna having diameter of 2.5 to 3 m which is larger than the above-mentioned standard A station, and which has the capability of carrying out high speed data communicatins, such as multiple telephone communications etc., with oil rigs and the like.

Meanwhile in the INMARSAT system, the frequencies used are such that 1.6/1.5 GHz band is used between the satellite and the mobile earth station, and 6/4 GHz band is used between the satellite and the coast earth station. Further, the so-called Demand assigned system is employed to assign the circuit to a desired station when traffic (message) transmission occurs. For telephones, the Frequency Modulation/Time Division Multiple Access (FM/TDMA) system is used. For low speed data such as telex, etc., Time Division Multiples (TDM) system coast earth station-mobile earth station) and TDMA system mobile earth station-coast earth station) based on Binary Phase Shift Keying (BPSK), are used.

The system of the standard C station of the INMARSAT (hereinafter simply referred to as INMARSAT STD-C system) will now be briefly described.

The INMARSAT STD-C system is composed, as shown in FIG. 2, of Circuit Terminating Equipment (DCE) 50 which interfaces with a satellite, and a Data Terminal Equipment (DTE) 80 which has a user interface. For example, when a message (data) is transmitted from a mobile earth station to a land station, data from the terminal, e.g., a word processor is subjected to a predetermined formatting at the DTE 80. Thereafter, error correction encoding and/or BPSK modulation, etc. is applied to the formatted data at the DCE 50. The data thus processed, is transmitted to the satellite using a frequency band of 1.6 GHz. Thereafter, the data is converted to a frequency band of 4 GHz. and is then amplified at the satellite. The data thus obtained is transmitted to the coast earth station. On the other hand, when sending a message (data) from a coast earth station to a mobile earth station, data is transmitted in a frequency band of 6 GHz from the coast earth station to the satellite. At the satellite, this data is converted to a frequency band of 1.5 GHz and is then amplified. The data thus obtained is transmitted to the DCE 50 of the mobile earth station. At the DCE 50, BPSK modulation and/or error correction, etc. are applied to the data, resulting in reproduced data. This reproduced data is sent to the terminal through the DTE 80.

As shown in FIG. 2, the DCE 50 is composed of an antenna (ANT) 51, a transmitting system circuit 60, a receiving system circuit 70, a changeover switch 52 for switching the antenna 51 between transmitting and receiving modes, a local oscillating circuit (SYNTH) 53 for delivering a carrier and a clock, etc. to the transmitting system circuit 60 and the receiving system circuit 70, and a controller 54 for establishing access control and/or handling messages.

More particularly, the transmitting system circuit 60 comprises a scrambler 61 for implementing pseudo random coding which power diffuses data from the controller 54, a convolutional encoder 62 for implementing a convolutional coding for carrying out error correction, an interleaving circuit 63 for implementing interleaving which converts burst error to random error, a BPSK modulation circuit 64 for carrying out binary phase shift keying, a multiplier 65 for converting a BPSK-modulated signal to a transmitting frequency signal, and a high power amplifier (HPA) 66 for amplifying the transmitting signal.

On the other hand, the receiving system circuit 70 comprises a low noise amplifier (LNA) 71 for amplifying a received signal from the antenna 51, a multiplier 72 for converting the received signal to an intermediate frequency signal, an IF circuit 73 for carrying out amplfication of the intermediate frequency signal, or the like, a BPSK demodulation circuit 74 for demodulating a BPSK modulated signal, a frame synchronous circuit 75 for pulling in frame of TDM, a deinterleaving circuit 76 for transforming interleaved data to data in its original form, a Viterbi decoder 77 for carrying out error correction of convolutionally coded data, and a descrambler 78 for transforming pseudo random coded data to data in its original form.

Meanwhile, demodulation (synchronous detection) in the BPSK modulation system is performed as follows. Namely, a phase comparison between a carrier, serving as reference, and a received signal is carried out. If the two are in phase, "1" is allocated, whereas if they are in out of phase, "0" is allocated. The demodulation is thus performed by making judgment of "0" and "1" using a symbol clock which is reproduced from the received signal.

In the INMARSAT STD-C system, data is received in burst form each frame. The carrier wave used for demodulation is provided by reproducing so called Carrier Recovery (CR) which is added, for example, to the leading portion of the frame, and transmitted therewith. Further, the above-mentioned symbol clock is provided by reproducing so called Bit Timing Recovery (BTR) similarly added (e.g., to the leading portion of the frame) and transmitted. Thus, demodulation is performed using reproduce the carrier and symbol clock, which have been reproduced, serving as reference.

In more actual terms, the BPSK demodulation circuit 74 comprises a multiplier for converting an intermediate frequency signal (hereinafter simply referred to as an IF signal) from IF circuit 73 to a BPSK modulated signal, and a BPSK demodulator.

The multiplier, i.e., the mixer within this BPSK demodulation circuit 74 serves to convert an IF signal to a BPSK modulated signal by using a carrier delivered from the local oscillating circuit 53, i.e., so-called carrier for down conversion.

Further, in the case of carrying out the BPSK demodulation by digital processing, the BPSK demodulator within the above-mentioned BPSK demodulation circuit 74 comprises an analog-to-digital converter (hereinafter referred to as an A/D converter) for converting a BPSK modulated signal to a digital signal, and a so-called digital signal processor (hereinafter referred to as a DSP) for digitally carrying out demodulation processing, etc. Viz., this A/D converter converts a BPSK modulated signal to a digital signal byusing a sampling clock from, for example, a quartz-crystal oscillator provided within the local oscillating circuit 53. Further, the DSP reproduces the above-described carrier, which serves as a reference for demodulation, from the converted BPSK modulated signal, and carries out (by way of example) synchronous detection by using the reproduced carrier to further reproduce the above-described symbol clock which is necessary to carry out judgment the "0" and "1" determination, and digitally execute the BPSK demodulation.

Meanwhile, in order to simplify demodulation digital processing in the DSP, it is necessary to bring the sampling clock of the A/D converter into synchronism with the above-mentioned reproduced symbol clock. To this end, a finely adjusted quartz-crystal oscillator is used as the quartz-crystal oscillator the above-mentioned oscillating circuit 53. However, even when the quartz-crystal oscillator is used, frequency accuracy of less than 1 ppm cannot be realized.

Further, reproduction of carrier or symbol clock in the DSP requires the following. Namely, Carrier Recovery and Bit Timing Recovery from the leading portion of a signal received in a burst format are used to carry out rapid reproduction so that an erroneous pulling into an erroneous phase or so called "slip", does not take place. Various devices which complicate the circuit configuration are required to achieve this. For example, circuitry is required to meet the conflicting requirements wherein a so-called Q parameter is required to be set to a high value in order to decrease the possibility that slip occurs, while being attenuated in order to avoid reproduction time being prolonged.

SUMMARY OF THE INVENTION

With the above actual circumstances in view, this invention has been made, and its object is to provide a local oscillating device which can easily synchronize a sampling clock for the A/D converter with a reproduced symbol clock; which can maintain, at the time of interruption of a received signal, the symbol clock for a longer time period in the state where a signal is received; which can reproduce, in a shorter time, a symbol clock synchronous with received data when a signal is received for a second time; and which can easily correct a transmitting frequency so that it is in correspondence with a frequency prescribed by a receiving frequency.

To achieve the above-mentioned object, this invention provides a local oscillating device comprising: local oscillating means including a quartz-crystal oscillator of which oscillating frequency can be controlled, analog-to-digital (A/D) converter means for converting a received phase modulated signal to a received digital signal by using a sampling clock from the local oscillating means, and demodulator means for reproducing a symbol clock serving as demodulation from the received digital signal from the A/D converter to demodulate the received digital signal by using the symbol clock, and to detect information indicative of a phase difference between the symbol clock and the sampling clock, thus to control an oscillating frequency of the quartz-crystal oscillator of the local oscillating means on the basis of the information indicative of a phase difference between the symbol clock and the sampling clock from the demodulator means to output a local oscillating signal of a predetermined frequency. Preferably, this local oscillating device is provided in a communication system of the half-duplex system. In that case, the local oscillating signal of a predetermined frequency taken out from the quartz-crystal oscillator is delivered to the transmission system of the communication system, thereby providing a transmitting frequency prescribed by the receiving frequency.

In accordance with the local oscillating device according to this invention, a sampling clock from the local oscillating means is used to convert a received phase modulated signal to a received digital signal. Further, this received digital signal is used to reproduce a symbol clock to detect information indicative of a phase difference between the symbol clock and the sampling clock. On the basis of the phase difference information, the oscillating frequency of the quartz-crystal oscillator of the local oscillating means is controlled so that the phase difference between the symbol clock and the sampling clock becomes equal to zero. Thus, a local oscillating signal of a predetermined frequency is outputted.

DESCRIPTION OF THE PREFERRED EMBODIMENT

A preferred embodiment of a local oscillating device according to this invention will now be described with reference to the attached drawings.

Figure 1:
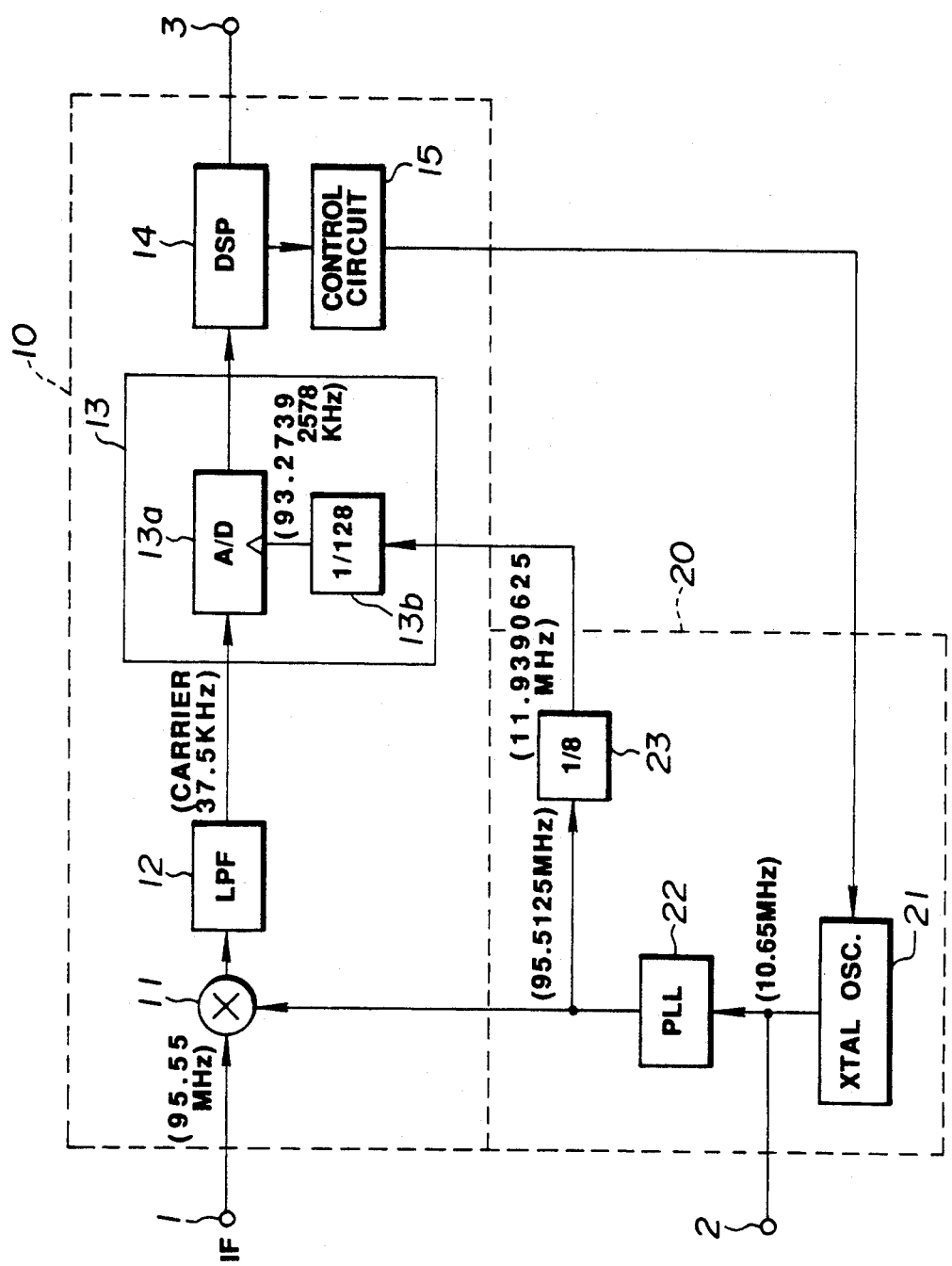
FIG. 1 is a block diagram showing the circuit configuration of a local oscillating device according to this invention.
Figure 2:
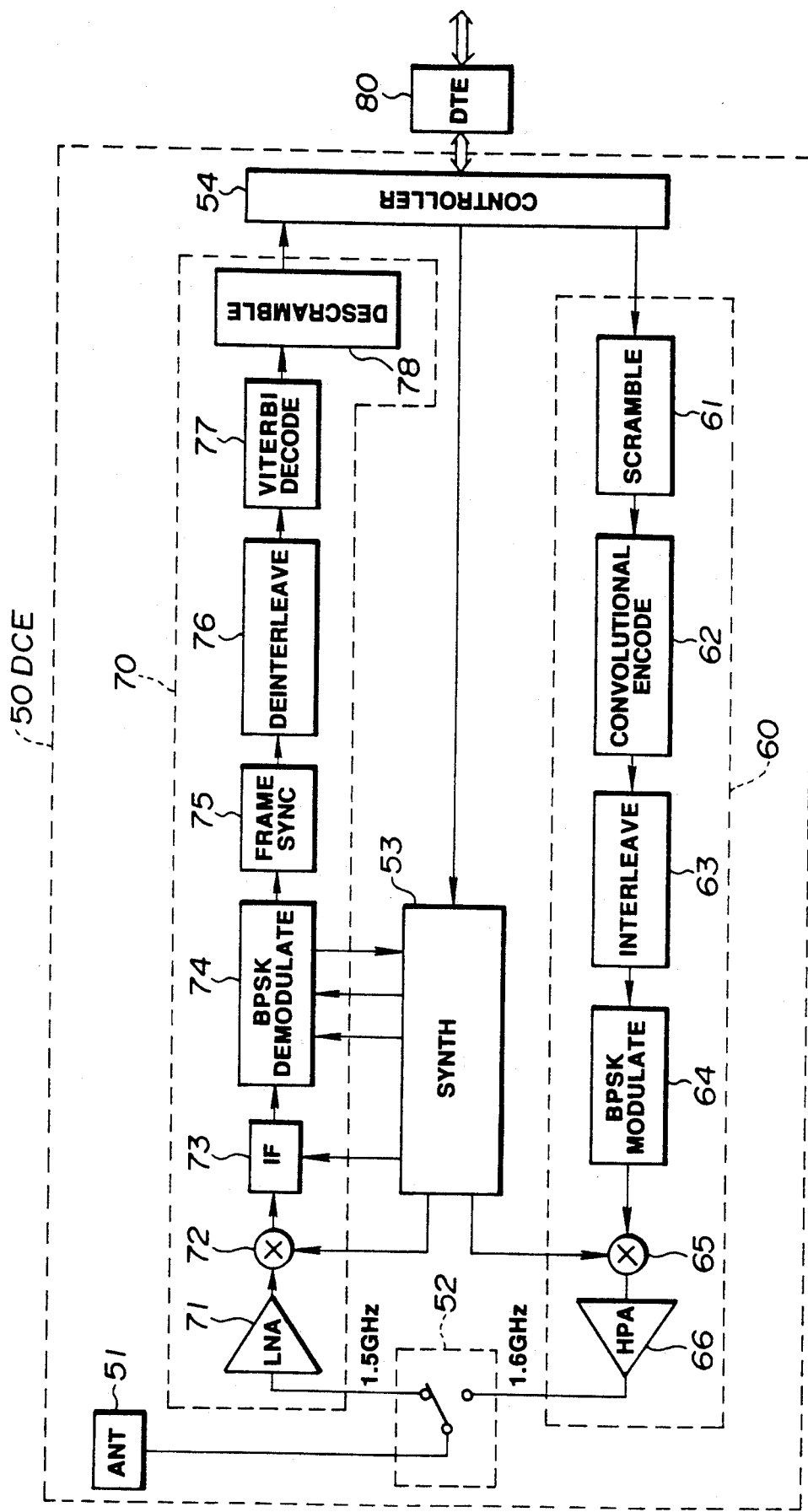
FIG. 2 is a block diagram showing the circuit configuration of an INMARSAT STD-C system.

In this embodiment, this invention is applied to the above-described INMARSAT STD-C system shown in FIG. 2. Namely, the local oscillating device according to this invention is roughly composed, as shown in FIG. 1, of a BPSK demodulation circuit 10 corresponding to the essential part of the above-described BPSK demodulation circuit 74 shown in FIG. 2, and a local oscillating circuit 20 similarly corresponding to the essential part of the above-described local oscillating circuit 53 shown in FIG. 2.

The BPSK demodulation circuit 10 comprises, as shown in FIG. 1, a multiplier 11 and a low-pass filter (hereinafter referred to as a LPF) 12 for converting an intermediate frequency signal (hereinafter referred to as an IF signal) to a BPSK modulated signal, an analog-to-digital converter circuit (hereinafter referred to as an A/D converter circuit) for converting the BPSK modulated signal to a digital signal, a DSP 14 for digitally carrying out demodulation processing and for detecting information indicative of a difference between a sampling clock and a reproduced symbol clock, and a control circuit 15 for controlling an oscillating frequency of a quartz-crystal oscillator 21 in the local oscillating circuit 20 on the basis of the phase difference information.

Moreover, the local oscillating circuit 20 comprises the above-mentioned quartz-crystal oscillator 21 of which oscillating frequency can be controlled, a phase locked loop (hereinafter referred to as a PLL) 22, and a frequency divider 23.

More particularly, the quartz-crystal oscillator 21 serves to generate a local oscillating signal (hereinafter referred to a clock) of 10.65 MGz (herein after the frequency of the clock or the signal is indicated by notation of parentheses). The PLL 22 serves to form so-called a carrier for down converter (95.5 125 MHz) synchronous with a clock from the quartz-crystal oscillator 21 to send this carrier for down converter to the multiplier 11. The frequency divider 23 serves to frequency-divide the carrier for down converter so that its frequency value becomes equal to one eighth thereof to form a clock (11.9390625 MHz=95.5125÷8) delivered to the A/D converter circuit 13.

The multiplier 11 serves to perform a multiplicative operation of an IF signal (95.55 MHz) delivered through the terminal 1 and the carrier for down converter from the PLL 22, i.e., mixing to convert the IF signal to a BPSK modulated signal (frequency of the carrier is 37.5 KHz=95.55−95.5125 (MHz)) to deliver the BPSK modulated signal to the A/D converter circuit 13 through the LPF 12.

The A/D converter circuit 13 is comprised of an A/D converter 13a and a frequency divider 13b. The frequency divider 13b serves to divide a clock from the frequency divider 23 by 128 to form a sampling clock (93.27392578 KHz=11.9 390625 (MHz)÷128). The A/D converter 13a serves to convert a BPSK modulated signal delivered through the LPF 12 to a digital signal the sampling clock.

The DSP 14 is comprised of a digital signal processor (hereinafter referred to as a DSP), and serves to reproduce a symbol clock from received data while data is being received to carry out BPSK demodulation as described above by using this symbol clock, and to detect information indicative of a difference between the reproduced symbol clock and the sampling clock to deliver the phase difference information to the control circuit 15.

The control circuit 15 serves to control the oscillating frequency of the quartz-crystal oscillator 21 on the basis of the phase difference information from the DSP 14. This control circuit 15 is operative to control the oscillating frequency of the quartz-crystal oscillator 21 on the basis of, e.g., the phase difference information so that the phase difference between the sampling clock and the symbol clock becomes equal to zero.

An actual control of the quartz-crystal oscillator 21 will now be described.

As described above, in the INMARSAT STD-C system, a signal is received in a burst manner. Accordingly, when a signal is being received, the DSP 14 reproduces a symbol clock synchronous with received data. The control circuit 15 controls the oscillating frequency of the quartz-crystal oscillator 21 so that a phase difference between the sampling clock and the symbol clock becomes equal to zero. As a result, the sampling clock and the symbol clock can be synchronized.

When reception of a signal is interrupted, the DSP 14 maintains the reproducing operation of the symbol clock in the state synchronous with a sampling clock immediately before reception of a signal is interrupted. The control circuit 15 controls the oscillating frequency of the quartz-crystal oscillator 21 so that a phase difference between the symbol clock and the sampling clock of which synchronisms are maintained becomes equal to zero. Namely, the frequency accuracy of the symbol clock when reception of a signal is interrupted becomes in correspondence with the oscillating frequency accuracy of the quartz-crystal oscillator 21. Thus, as long as the oscillating frequency of the quartz-crystal oscillator 21 does not change, the symbol clock maintains the state immediately before reception of a signal is interrupted. In other words, it is possible to maintain the symbol clock for a longer time in the state immediately before reception of a signal is interrupted.

When a signal is received for a second time, the DSP 14 allows the symbol clock having the oscillating frequency accuracy of the quartz-crystal oscillator 21 to be synchronous with received data. As a result, the time required until the symbol clock is caused to be synchronous with received data can be reduced to much degree as compared to the prior art.

Namely, in the local oscillating device constructed as above, the sampling clock can be allowed to by synchronous with the symbol clock reproduced from received data while data is being received. Thus, the configuration of the DSP 14 for digitally processing BPSK demodulation and/or the digital computational processing can be simplified. Further, when reception of a signal is interrupted, the oscillating frequency of the quartz-crystal oscillator 21 is maintained in the state immediately before that interruption. The regenerative operation of the symbol clock is carried out in the DSP 14 by using, as reference, a sampling clock derived from a clock from the quartz-crystal oscillator 21. When a signal is received for a second time, the symbol clock can be synchronous with received data in a short time.

In addition, by taking out, as a clock for transmission, i.e., a local oscillating signal, through the terminal 2, a clock from the quartz-crystal oscillator 21 controlled on the basis of the received data to convert the clock thus taken out so that it has a predetermined frequency to deliver it to the BPSK modulation circuit 64 or the multiplier 65, etc. shown in the above-described FIG. 2, the transmitting frequency can be easily corrected in the half duplex system so that it becomes equal to a frequency prescribed by the receiving frequency.

As is clear from the foregoing description, the local oscillating device according to this invention operates as follows. At the A/D converter means, a received phase modulated signal is converted to a received digital signal by using a sampling clock from the local oscillating means. At the demodulator means, a symbol clock is reproduced by using the received digital signal and the received digital signal is demodulated by using the symbol clock. Further, information indicative of a phase difference between the symbol clock and the sampling clock is detected. On the basis of this phase difference information, the oscillating frequency of the quartz-crystal oscillator of the local oscillating means is controlled so that the phase difference between the symbol clock and the sampling clock becomes equal to zero to output a local oscillating signal of a predetermined frequency. As a result, the sampling clock from the local oscillating means can be easily caused to be synchronous with the symbol clock. Thus, the configuration of the demodulator means and/or the digital computational processing can be simplified. Further, when reception of a signal is interrupted, it is possible to maintain the symbol clock for a longer time in the state where a signal is being received. Further, when a signal is received for a second time, a symbol clock synchronous with received data can be reproduced in a short time.

In addition, by using, as a clock for transmission, a clock from the local oscillating means of which oscillating frequency is controlled, i.e., a local oscillating signal, on the basis of received data, the transmitting frequency can be easily corrected so that it has a frequency prescribed by the receiving frequency.

What is claimed is:

1. A local oscillating device comprising:
   means for providing a phase modulated signal;
   local oscillating means including a quartz-crystal oscillator having an oscillating frequency which can be controlled, and for providing a sampling clock;
   analog-to-digital (A/D) converter means for receiving and converting said phase modulated signal to a received digital signal by using said sampling clock from said local oscillating means;
   demodulator means for receiving said received digital signal from said A/D converter means and reproducing a symbol clock serving as a demodulation reference to demodulate said received digital signal by using said symbol clock, and to detect information indicative of a phase difference between said symbol clock and said sampling clock; and
   means cooperating with said demodulator means for controlling an oscilalting frequency of said quartz crystal oscillator of said local oscillating means on the basis of the information indicative of the phase difference between said symbol clock and said sampling clock from said demodulator means, thus to output a local oscillating signal of a predetermined frequency from said local oscillating means.

2. A local oscillating device as set forth in claim 1, wherein said received phase modulated signal is an analog signal which has been subjected to binary phase shift keying (BPSK).

3. A local oscillating device as set forth in claim 2, wherein said local oscillating means further includes a phase locked loop for generating a carrier synchronous with an input clock to said quartz-crystal oscillator, and a frequency divider for frequency-dividing said carrier so that it has a predetermined divided frequency value to form said sampling clock provided to said A/D converter means.

4. A local oscillating device as set forth in claim 3, which further comprises multiplier means for multiplying an intermediate frequency signal of a received signal by said carrier from said phase locked loop to convert said intermediate signal to said received BPSK modulated signal.

5. A local oscillating device as set forth in claim 4, wherein said demodulator means comprises a digital signal processor for digitally carrying out BPSK demodulation processing and for detecting information indicative of a phase difference between said sampling clock and said reproduced symbol clock, and said controlling means controlling an oscillating frequency of said quartz-crystal oscillator on the basis of said information indicative of said phase difference.

6. A local oscillating device as set forth in claim 1, wherein said local oscillating device is provided in a communication system of a half-duplex system.

7. A local oscillating device as set forth in claim 6, wherein said local oscillating signal of a predetermined frequency from said quartz-crystal oscillator is delivered to the transmission system of said communication system, thereby providing a transmitting frequency prescribed by the receiving frequency.

8. A local oscillating device used for a communication system where binary phase shift keying (BPSK) is employed to implement frequency conversion to a data signal received in a burst manner, comprising:
   frequency converter means for converting an intermediate frequency signal of a received data signal to a received BPSK modulated signal;
   local oscillating means including a quartz-crystal oscillator having a controllable oscillating frequency, and for providing a sampling clock therefrom;
   analog-to-digital (A/D) converter means for converting said received BPSK modulated signal to a corresponding received digital data signal by using said sampling clock from said local oscillating means;
   demodulator means for reproducing a symbol clock serving as a demodulation reference from said received digital data signal from said A/D converter to demodulate said received digital data signal by using said symbol clock, and to detect information indicative of a phase difference between said symbol clock and said sampling clock; and
   means to control an oscillating frequency of said quartz-crystal oscillator of said oscillating means on the basis of the information indicative of a phase difference between said symbol clock and said sampling clock from said demodulator means to output a local oscillating signal of a predetermined frequency.

9. A local oscillating device as set forth in claim 8, wherein said communication system is formed as a half duplex system.

10. A local oscillating device as set forth in claim 9, wherein said local oscillating signal of a redetermined frequency from said quartz-crystal oscillator is delivered to the transmission system of said communication system, thereby providing a transmitting frequency prescribed by the receiving frequency.

* * * * *